United States Patent [19]

Folkmann

[11] 4,450,417

[45] May 22, 1984

[54] FEED FORWARD CIRCUIT

[75] Inventor: Andrew F. Folkmann, Cedar Rapids, Iowa

[73] Assignee: Rockwell International Corporation, El Segundo, Calif.

[21] Appl. No.: 334,859

[22] Filed: Dec. 28, 1981

[51] Int. Cl.³ .................. H03H 11/04; H03H 11/02
[52] U.S. Cl. ............................. 333/24 R; 333/17 R; 333/174; 330/124 R
[58] Field of Search ............... 333/1, 1.1, 2–5, 333/17 R, 24 R, 109–112, 115–123, 132, 134, 174–176, 202, 207–209, 245, 246, 248; 330/124 R

[56] References Cited

U.S. PATENT DOCUMENTS

| | | | |
|---|---|---|---|
| 3,030,501 | 4/1962 | Rapuano | 333/24 X |
| 3,234,555 | 2/1966 | Petrilla et al. | 333/24 X |
| 3,649,927 | 3/1972 | Seidel | 330/124 R |
| 3,715,690 | 2/1973 | Young et al. | 333/17 |

FOREIGN PATENT DOCUMENTS 1562942 4/1977 United Kingdom .............. 333/102

OTHER PUBLICATIONS

Prochazka et al.–"Design of a Wideband Feed Forward Distribution Amplifier," IEEE Transactions on Consumer Electronics, Nov. 1976, pp. 349-356.

*Primary Examiner*—Marvin L. Nussbaum
*Attorney, Agent, or Firm*—Richard K. Robinson; George A. Montanye; H. Fredrick Hamann

[57] ABSTRACT

A feed forward circuit that can be used as an isolator or filter includes a first and a second directional coupler that, depending on the application, either splits an applied signal into two paths or combines the two paths to obtain an output signal. One path includes an electronically tunable band reject filter (or notch filter) which may be bypassed by a switch in the isolator application, and an inverting amplifier. The second path includes a delay line that compensates for the time delay of the signal in the first path due to the time delay of the inverting amplifier and electronically tunable band reject filter.

15 Claims, 8 Drawing Figures

FEED FORWARD CIRCUIT

The Government has rights in this invention pursuant to contract number N00019-78-C-0501, awarded by the United States Navy.

BACKGROUND OF THE INVENTION

This invention relates to feed forward circuits, and in particular, to a feed forward circuit that can serve as a feed forward isolator circuit or a feed forward filter circuit.

Electronically tunable bandpass filters that operate in the radio frequency range are generally obtained through tuning devices in which the reactance properties are a function of voltage or current. A varactor diode is an example of this type of tuning device although other types exist. The voltage or current applied to the tuning device is time variant when a radio frequency signal is present. In order to avoid excessive distortion, the ratio of the radio frequency signal to the bias signal that controls the reactance of the tuning device must be small. This restriction limits the application of radio frequency circuits that includes these devices to low signal levels, generally less than one watt. Additionally, a filter using this type of tuning device provides, due to the relatively low Q (the figure of merit of tuned circuits and filters), a high insertion loss to the radio frequency source to which the filter is connected.

An alternate approach in the prior art is to use electronically switched binary arrays of capacitors, inductors, or both to tune the circuit's passband frequency. The large number of tuning steps required for tuning these arrays makes them practical only for applications where the ratio of the tuning bandwidth to the tuned circuit's pass bandwidth is small.

Isolators of the prior art designs are generally limited to high frequencies (VHF and above) and to relatively narrow bandwidths (approximately 30%).

SUMMARY OF THE INVENTION

A feed forward circuit that can be used as an isolator or filter includes a first and a second directional coupler that, depending on the application, either splits an applied signal into two paths or combines the two paths to obtain an output signal. One path includes an electronically tunable band reject filter (or notch filter) which may be bypassed by a switch in the isolator application, and an inverting amplifier. The second path includes a delay line that compensates for the time delay of the signal in the first path due to the time delay of the inverting amplifier and electronically tunable band reject filter.

The feed forward circuit in the filter mode uses the first directional coupler for providing a sample of a radio frequency signal applied to a first terminal of the feed forward circuit to obtain a first signal and a sampled signal. The electronically tunable band reject filter provides a high attenuation to frequencies of the sampled signal that are at the tuned frequency of the electronically tunable band reject filter. The inverting amplifier inverts and amplifies the filtered sampled signal; and the second directional coupler combines the inverted and amplified filtered sampled signal with the first signal to provide an output signal having dominant frequencies located in a bandwidth around the tuned frequency of the electronically tunable band reject filter at a second terminal. Compensation for the time delay introduced into the circuit by the inverting amplifier and electronically tunable band reject filter is provided by a time delay line connected between the first directional coupler and the second directional coupler.

The electronically tunable band reject filter includes a third directional coupler for splitting the sampled signal into a first sampled signal and a second sampled signal. A bandpass filter that has a variable center frequency passes only frequencies of the first sampled signal that are in the bandwidth around the selected center frequency. A fourth directional coupler obtains the difference between the second sampled signal and the filtered first sampled signal at a difference terminal and, consequently, provides a high degree of rejection to frequencies around the selected frequency band.

There are several embodiments of the electronically tunable band reject filter provided including various means of electronically tuning the filter and compensating for coupling variations in the directional couplers.

When the feed forward circuit is used as an isolator, the electronically tunable band reject filter is bypassed by a switch. The radio frequency signal is applied to the second terminal of the second directional coupler where a sample of the reflected power from the first directional coupler and inverting amplifier is subtracted from the radio frequency signal. Thus, the power that is applied to the second directional coupler appears on the first terminal of the first directional coupler after passing through the delay line which compensates for the time delay of the inverting amplifier, but the power reflected from the first directional coupler is cancelled and is not seen at the second terminal of the second directional coupler.

It is the objective of this invention to provide a feed forward circuit that will provide an electronically tunable bandpass filter with low insertion loss that is capable of handling high power levels.

It is another objective of the invention to provide a feed forward circuit that serves as an isolator at HF through UHF and above frequencies with low insertion loss and greater than octave bandwidths of isolation.

It is yet another object of the invention to provide a feed forward circuit that requires only a sample of an input radio signal to be filtered.

These and other objectives, features and advantages of the present invention will appear more fully from the following description of the preferred embodiments taken in conjunction with the drawings.

DETAILED DESCRIPTION OF THE PREFERRED EMBODIMENT

Figure 1:
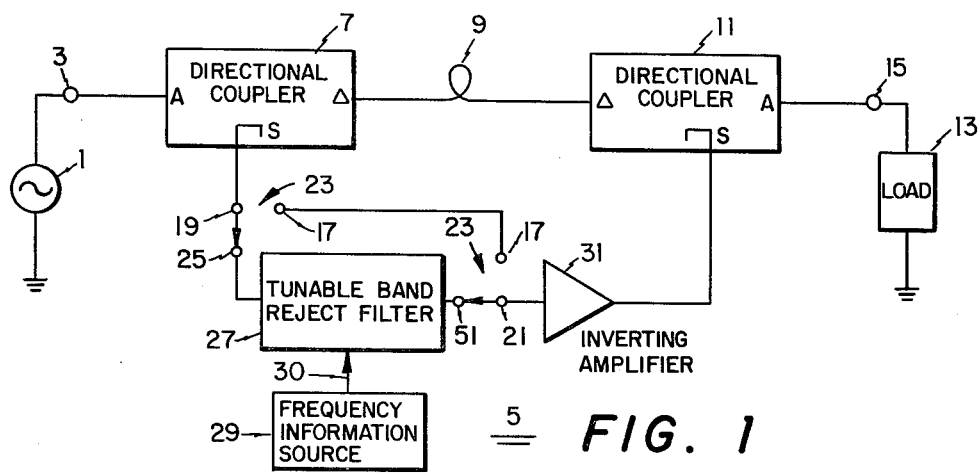
FIG. 1 is a block diagram of the feed forward circuit used as a bandpass filter according to the invention.
Figure 3:
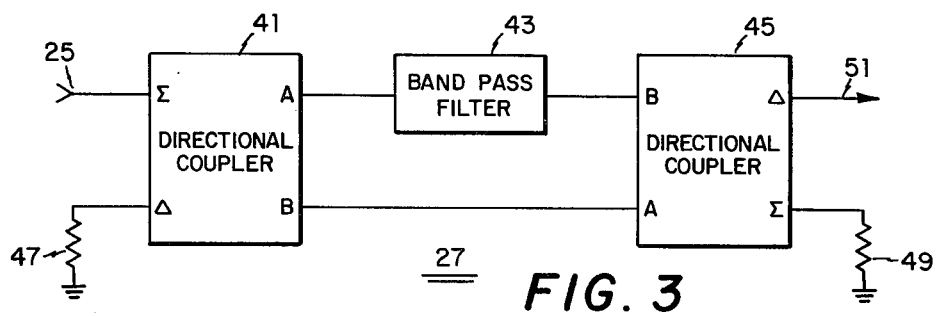
FIG. 3 is a block diagram of a band reject filter used in the feed forward circuit of FIG. 1.
Figure 4:
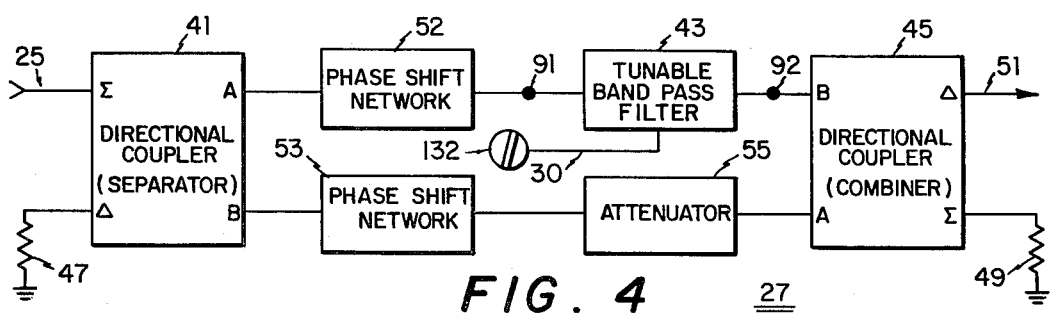
FIG. 4 is an embodiment of a tunable band reject filter.

In FIG. 1, to which reference should now be made, a signal source 1, such as a radio transmitter, provides a radio frequency signal to terminal 3 for application to the feed forward circuit 5. The radio frequency signal travels through a first directional coupler 7, via terminals A and Δ, a delay line 9, and a second directional coupler 11 via terminals Δ and A, to a load 13, such as an antenna, via an output terminal 51. The directional couplers 7 and 11, in the preferred embodiment, are the sampling type of directional couplers and are shown having three terminals: an A terminal, an S terminal and a Δ terminal. The signal that is present on the S terminal is representative of the signal that is present on the A terminal but approximately 20 dB less than the signal that is present on the A terminal. The signal that is present on the Δ terminal is identical to the signal that is on the A terminal minus the signal that is on the S terminal. A sample of the radio frequency signal is provided by the directional coupler 7 at terminal S. When terminal 21 of a double pole switch 23 is connected to point 51, and terminal 19 is connected to terminal 25, the feed forward circuit is a bandpass filter and the radio frequency signal is filtered by a tunable band reject filter 27. Although the tunable band reject filter 27 is shown having an electronically tunable center frequency, a filter having a fixed center frequency as shown in FIG. 3 or a mechanically tunable center frequency as shown in FIG. 4 may be used in the appropriate application. The tunable band reject filter 27 is provided frequency information from the frequency information source 29 which centers the stop band of the tunable band reject filter on the desired frequency. A stop band is defined as the area of maximal rejection in decibels, db, and is sometimes referred to as a notch which represents the visual appearance of the frequency response of a filter when plotted on a curve showing frequency versus attenuation. The gain of the inverting amplifier 31 is to compensate for the coupling losses of directional coupler 7 and 11 and the tunable band reject filter 27. The tunable band reject filter 27 provides a high attenuation to frequencies of the radio frequency signal at the tuned frequency which is hereinafter referred to as the center frequency, $f_O$. All other frequencies of the sampled signal are amplified by the inverting amplifier 31. The output of the inverting amplifier 31 is recombined with that portion of the radio frequency signal that passes through the delay line 9 by the directional coupler 11. Except in the immediate vicinity of the center frequencies, the phase shift through the tunable band reject filter 27 is a linear function of the frequency; i.e., constant time delay. The time delay through the delay line 9 is selected to be equal to the total time delay of the tunable band reject filter 27 and the inverting amplifier 31. Consequently, any frequency outside of the stop band of the tunable band reject filter 27 is cancelled by the combination action of the directional coupler 11 and does not appear at the output terminal 15. Thusly, a low signal level (approximately 1 watt) band reject filter can be used to realize a high power (100 watt) pass filter with an insertion loss of approximately 0.5 db.

In the application where the feed forward circuit 5 is inserted between a transmitter and an antenna, the frequency information required for the tunable band reject filter 27 may be derived from the transmitter or directly from the input signal. The latter case allows the feed forward circuit to be used to clean up the output of an existing transmision system without the necessity of modifying the equipment. (See illustration in FIGS. 7 and 8.)

Figure 2:
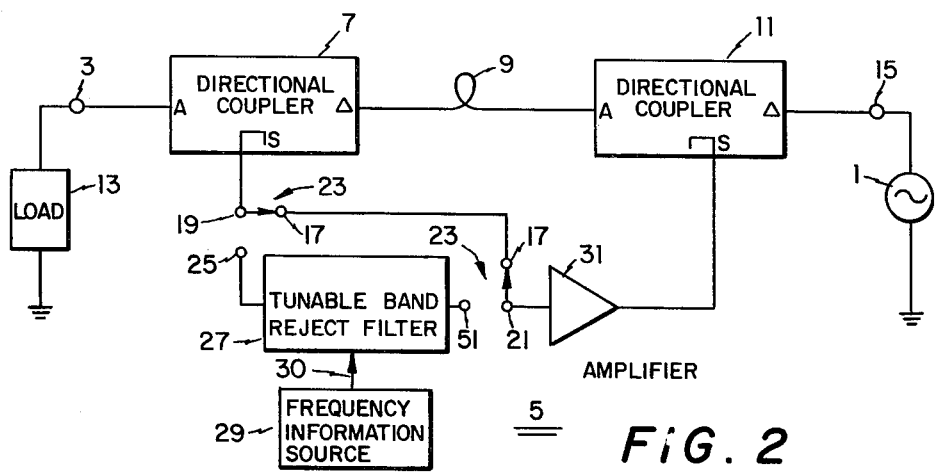
FIG. 2 is a block diagram of the feed forward circuit used as an isolator.

When terminal 21 of the double pole switch 23 is connected to terminal 17 and terminal 19 is also connected to terminal 17, the electronically tunable band reject filter 27 is bypassed and the feed forward circuit 5 functions as an isolator with terminal 15 being the input terminal. FIG. 2 illustrates this embodiment. A sample of the power reflected from the load at terminal 3 is provided to the directional coupler 11 via the directional coupler 7, and amplifier 31. The directional coupler 11 causes the reflected power that is conducted to it to be cancelled. The power that is applied to terminal 15 appears at terminal 3 but the power reflected from terminal 3 is cancelled and is not seen at terminal 15. This nonreciprocal power transfer of the feed forward circuit 5, thus, is identical to that of an isolator. Thus, the feed forward circuit 5 is an isolator with a feed back path that runs from terminal S of the directional coupler 7, through the amplifier 31 and terminal S of the directional coupler 11. The gain of the amplifier 31 is set to compensate for coupling losses of the directional couplers 7 and 11.

FIG. 2 also represents an alternate embodiment of FIG. 1. The amplifier 31 in FIG. 2 is a non-inverting amplifier. Consequently, the Δ terminal of directional coupler 11 is connected to terminal 51 and the A terminal of directional coupler 11 is connected to delay line 9. If the amplifier 31 were an inverting amplifier then the directional coupler 11 of FIG. 1 would be utilized.

Although there are many types of notch, or band reject, filters known in the art, the preferred embodiment provides for a band reject filter such as that disclosed in my copending application Ser. No. 334,957 entitled, "Electronically Tunable Band Reject Filter", filed on Dec. 12, 1981 and assigned to the assignee of the present invention. This filter is shown in FIG. 3 in which there is provided two directional couplers 41 and 45 and a bandpass filter 43, which when connected as shown in FIG. 3, achieves the frequency response characteristic of a band reject filter. The bandpass filter 43, in the embodiment of FIG. 3, is a fixed bandpass filter and consequently the band reject filter in which it is included has a fixed center frequency. However, the bandpass filter 43 may be a tunable bandpass filter such as the mechanically tunable bandpass filter 43 of FIG. 4 or the electronically tunable bandpass filter 43 of FIG. 6. In the preferred embodiment, the directional couplers 41 and 45, are equal split (3 dB) directional couplers and the bandpass filter 43 in the ideal case is lossless with no insertion phase shift at $f_O$, the center frequency of the bandpass filter 43. Signals that are applied to terminal 25 that have frequencies in the bandwidth around the center frequency, $f_O$, are supplied in sampled form by the directional coupler 41 and recombined in the directional coupler 45. The combination appears at the summation port, Σ, of the directional coupler 45. For the frequencies outside the bandpass of the bandpass filter 43 only that portion of the signal that is conducted from terminal B of the directional coupler 41 to terminal A of the directional coupler 45 reaches the output terminals of the directional coupler 45 and is split equally between the Σ and the Δ terminals of the directional coupler 45. Resistor 47 and 49 are termination resistors and are matched to the characteristic impedance of the directional couplers 41 and 45 respectively. The resultant frequency response of the network has a low, ≃6.0 dB, insertion loss at all frequencies outside the passband of the tunable band pass filter 43 and a deep notch at the center frequency. The relative coupling between the A and B ports of the directional couplers 41 and 45 may be of any ratio and need not be restricted to the 3 dB case as shown in the embodiment of FIG. 3.

The phase shift that is introduced by the bandpass filter 43 may be compensated for by using nonidentical directional couplers; and, thus, the directional coupler 41 may be different from directional coupler 45 such that the phase shift that is introduced by the bandpass filter 43 is compensated for. In the case where 3 dB directional couplers are used, phase shifts in multiples of 90° can be corrected for by using a 90° directional coupler for the directional coupler 41 and an in-phase/180° directional coupler for the directional coupler 45. Alternatively, the bandpass filter 43, as will be discussed later, may be corrected for phase error by slightly detuning one or more of the poles of the bandpass filter 43.

The insertion loss of the bandpass filter 43 can easily be accommodated. This embodiment is shown in FIG. 4, to which reference should now be made. An attenuator 55 in the lower signal path is connected between the B terminal of the directional coupler 41 and the A terminal of the directional coupler 45, and compensates for the insertion loss attributed to the bandpass filter 43. An alternative phase shift compensation is provided by phase shift networks 52 and 53 that compensate for the phase shift that is introduced by the bandpass filter 43. The bandpass filter 43, in the embodiment of FIG. 4, is a mechanically tunable bandpass filter 43 and, consequently, the band reject filter in which it is included has a tunable center frequency which may be tuned by rotating tuning knob 132 which causes the drive shaft 30 to rotate, varying the reactance of a tuned circuit to which the drive shaft 30 is connected. However, the bandpass filter 43 may be an electronically tunable bandpass filter such as the electronically tunable bandpass filter 43 of FIG. 6 or the fixed tuned bandpass filter 43 of FIG. 3.

Figure 5:
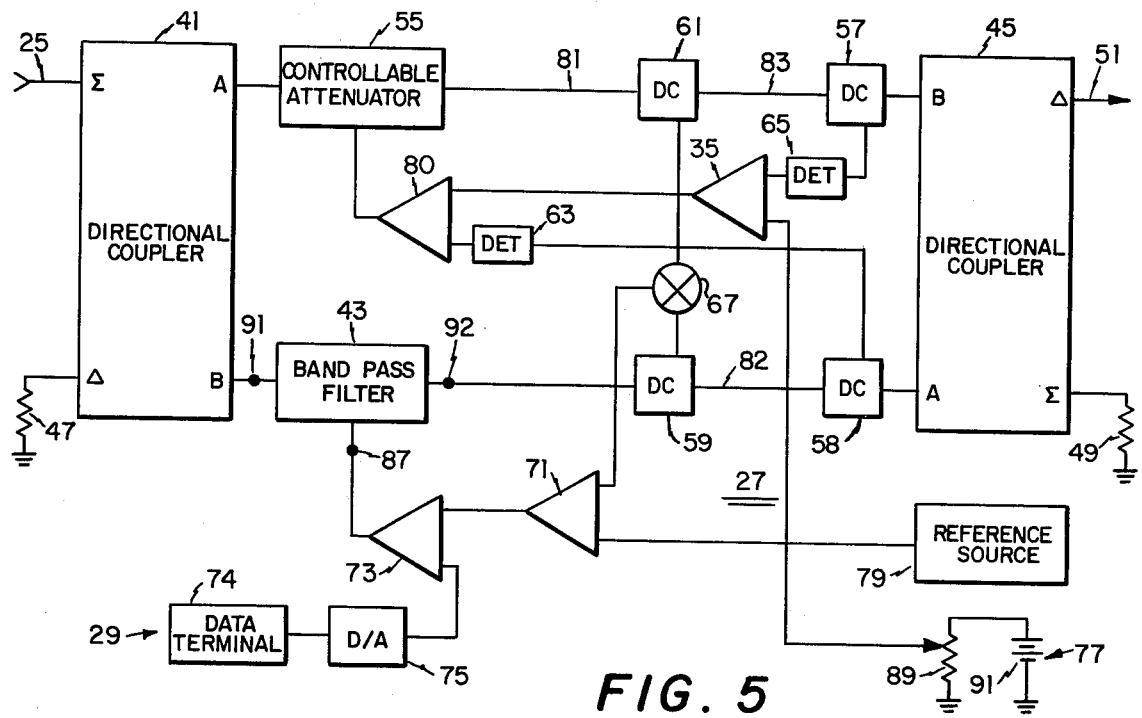
FIG. 5 is yet another embodiment of the tunable band reject filter.

In the preferred embodiment a deep null at the Δ port of the directional coupler 45 is obtainable only when there is an accurate phase and amplitude balance of the signals that are applied to the A and B terminals of the directional coupler 45. An ideal directional coupler has infinite directivity and no coupling variations across the band of frequencies to which the tunable band reject band reject filter 27 is operated. The signals that are applied to the A and B terminals of the directional coupler 45 must be within 0.09 dB amplitude and 0.5° phase balance to obtain a 40 dB null or notch. Since the phase and amplitude imbalance of directional couplers may be an order of magnitude greater than these limits, additional control circuits in the preferred embodiment are utilized to maintain a high degree of cancellation over the entire bandwidth. In the embodiment of FIG. 5 a band reject filter with 50 dB of cancellation tunable over an octive bandwidth is illustrated. A balance in the amplitude of the signal that is applied to terminal B of the directional coupler 45 is maintained with the signal that is applied to terminal A of directional coupler 45, by an amplitude balancing circuit that partially includes a voltage sensor (Directional Coupler) DC 57 and a voltage sensor 58. The voltage that is sensed by the voltage sensor (Directional Coupler) DC 57 is applied to a detector 65 and the voltage that is sensed by the voltage sensor (Directional Coupler) DC 58 is applied to a detector 63. Variable gain amplifier 35 is nominally a unity gain amplifier. The gain of variable gain amplifier 35 can be varied slightly, however, under the control of reference source 77 to compensate for differences in the sensitivity of detectors 63 and 65 and for variation in coupling between the A and B ports of coupler 45. The reference source 77 is illustrated as a voltage source 91 and a variable resistor 89. The difference amplifier 80 obtains the difference in amplitude of the amplified detected voltage provided by the variable gain amplifier 35 with the detected voltage from the detector 63 to obtain a control signal that is used to control a controllable attenuator 55. The controllable attenuator 55 adjusts the amplitude of the signal on conductor 81 to correct for any voltage imbalances indicated by the difference signal from the difference amplifier 80.

Phase balance is obtained through a balancing circuit that includes a mixer 67, two phase sensors (Directional Couplers) DC 59 and 61, and a difference amplifier 71. The phase sensor (Directional Couplers) DC 59 and 61 pick up samples of the voltages that are on conductors 82 and 83. The sample of these voltages are applied to a phase detector which in the preferred embodiment is a mixer 67 with the resulting mixed signal being applied to the difference amplifier 71. The difference amplifier obtains the difference between the mixed signal and a reference signal that is provided by a reference source 79 and the difference is used to control the bandpass filter 43. In the preferred embodiment, the adjustment of the reference source 79, which is a variable dc source, is used to adjust or fine tune one of the poles of the bandpass filter 43 when it is a multiple pole filter, or the single pole if the bandpass filter is a single pole filter. The output from the difference amplifier 71 is applied to a second difference amplifier 73 which has a reference source from a voltage source such as a data terminal 74 and a D/A converter 75 that generates a reference voltage for comparison with the output of the difference amplifier 71. The difference is applied to the bandpass filter 43 via terminal 87. In the case where the bandpass filter 43 is a single pole filter, then both the phase adjustment and tuning of the central frequency $f_0$ is controlled by the voltage that is applied to the terminal 87 via the difference amplifier 73 which has a reference source from a voltage source such as the data terminal 74 and the D/A converter 75 that generates a reference voltage for comparison with the output of the difference amplifier 71. The difference is applied to the bandpass filter 43 via terminal 87. When bandpass filter 43 is a single pole filter, then both the phase adjustment and tuning of the central frequency $f_0$ is controlled by the voltage that is applied to the terminal 87 via the difference amplifier 73. Although the reference sources 29, 77 and 79 are shown as being different versions of adjustable voltage sources, in the preferred embodiment the reference sources are all three the embodiment of the reference source 29.

Figure 6:
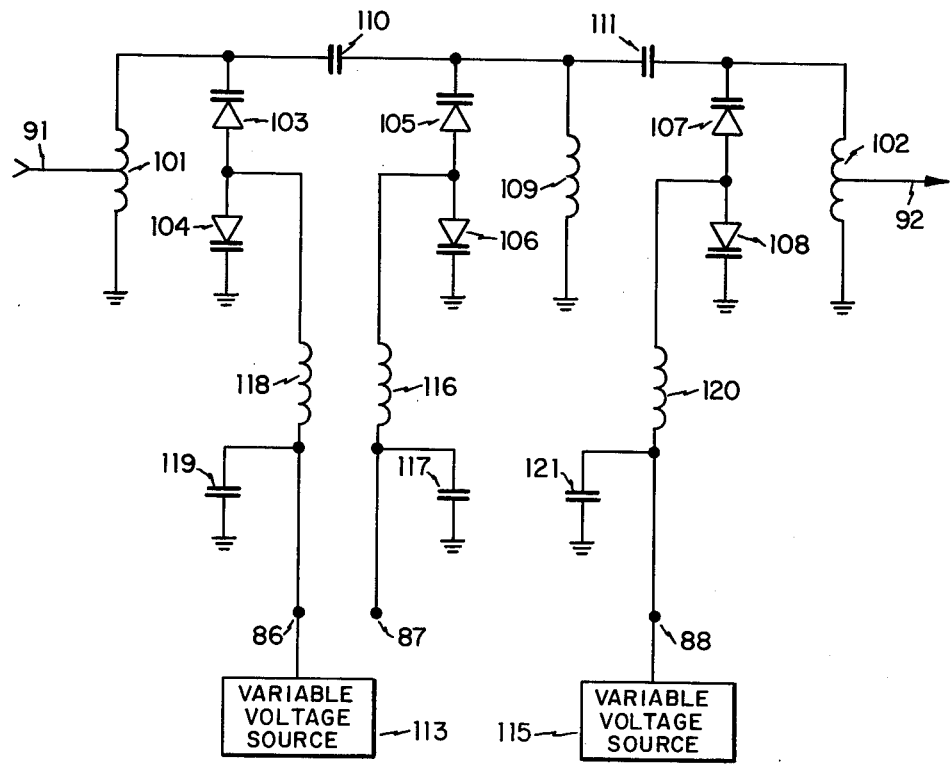
FIG. 6 is a circuit diagram of a tunable bandpass filter according to the invention.

FIG. 6 is a three-pole bandpass filter 43 that is electronically tunable and can be used as the tunable bandpass filter 43 of FIG. 5. In addition to the adjustment that is made to the voltage terminal 87, coarse tuning is provided by the variable voltage sources 113 and 115. The three-pole filter consists of an input transformer 101 which couples the RF signal from terminal 91 to the varactor pair that includes varactors 103 and 104. The voltage source 113 sets the reactance of the varactor pair 103 and 104 by applying a voltage to the two varactors via the RF blocking coil 118. Lowpass filtering is provided by capacitor 119. The second stage of the filter is connected to the first stage by capacitor 110 and includes a varactor pair that includes varactors 105 and 106. Terminal 87 is connected to the junction of the two varactors by the RF blocking inductor 116 and 117, and provides a low pass filter to the signal that is present at terminal 87. The three stages of the filters are matched; so, consequently, there is an inductor 109 which is part of the tank circuit which includes the two varactors 105 and 106. The third stage is coupled to the second stage via capacitor 111 and includes the output transformer 102 and the two varactors 107 and 108. There is an RF blocking inductor 120 and a low frequency filtering capacitor 121 which passes the DC tuning voltage from the variable voltage source 115 to varactors 107 and 108, but prevents the RF signal present on the varactors from reaching the variable voltage source 115.

Figure 7:
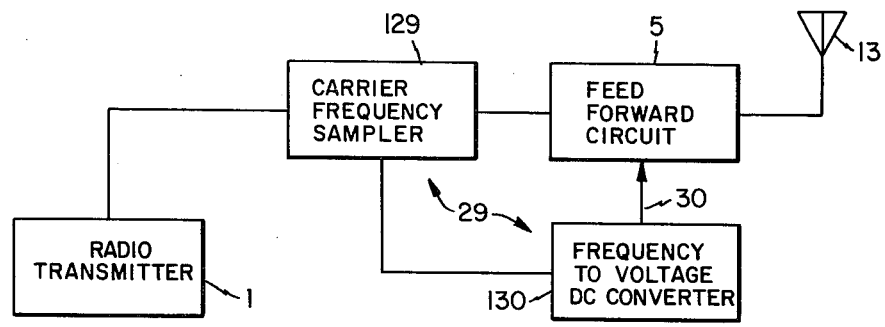
FIG. 7 is a block diagram of an automatically tunable bandpass filter.

As was discussed earlier, there are applications where the feed forward circuit 5 is inserted between a transmitter and an antenna. The frequency information required for the electronically tunable band reject filter may be derived directly from the input signal as shown in FIG. 7 to which reference should now be made. A radio transmitter 1 is the signal source that provides a signal to the feed forward circuit 5 and the antenna 13. The frequency information source 29 consists of a carrier frequency sampler 129 which samples the carrier frequency provided by the radio transmitter 1 and passes the sample to a frequency-to-voltage converter 130. The frequency-to-voltage converter 130 converts the sample into a signal to which the electronically tunable band reject filter 27 will respond.

Figure 8:
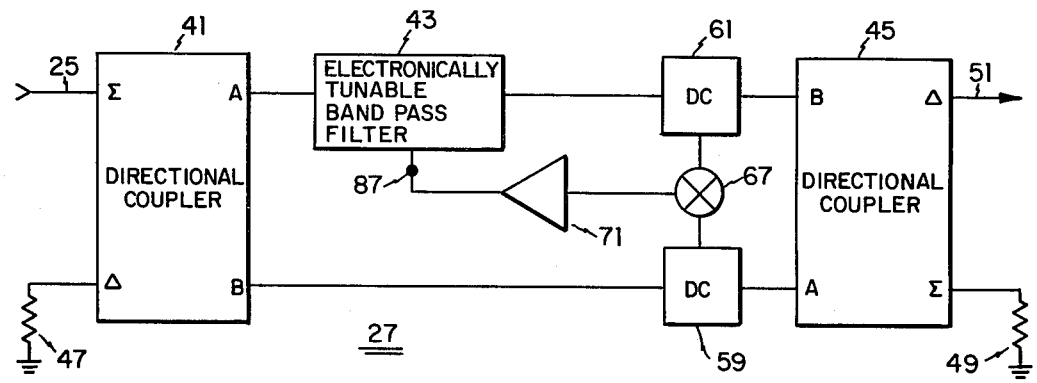
FIG. 8 is a block diagram of an automatically tunable band reject filter.

The preferred embodiment is illustrated in FIG. 8 in which the tuning voltage is generated within the tunable band refect filter 27. The radio frequency signal is provided from the signal source 1 via terminal 25 of the directional coupler 41 which splits the sampled signal on terminal 25 into two signals, one of which is present on terminal A and the other is present on terminal B. The signal that is present on terminal A is passed through the electronically tunable bandpass filter 43 and the directional coupler 61 to terminal B of the directional coupler 45. The signal that is present on terminal B of the directional coupler 41 is connected to terminal A of the directional coupler 45 via the directional coupler 59. The directional couplers 59 and 61 sample the signals that are present on terminal A and terminal B of the directional coupler 45, respectively. The sampled signals are mixed by the mixer 67 which detects the phase difference between the signals on terminals A and B of the directional coupler 45. Amplifier 71 amplifies the detected phase signal and applies it to terminal 87 of the electronically tunable bandpass filter 43 which selects, based upon the amplified phase detect signal, the center frequency, $f_O$, of the electronically tunable bandpass filter 43.

Many changes and modifications in the above described embodiment of the invention can, of course, be carried out without departing from the scope thereof. Accordingly, the scope is intended to be limited only by the scope of the appended claims.

I claim:

1. An isolation circuit comprising:
a first signal means having first, second and third terminals for providing at said first terminal a signal which is the sum of the signals on said second and third terminals;
amplifier means for amplifying a signal on said second terminal and providing an amplified output; and
second signal means having fourth, fifth and sixth terminals for providing a signal on said sixth terminal which is the difference between a signal on said fourth and fifth terminals, said third terminal being coupled to said fourth terminal and said fifth terminal being coupled to receive said amplified output.

2. An isolation circuit comprising:
a first signal means having first, second and third terminals for providing a signal on said first terminal which is the sum of signals on said second and third terminals;
inverting amplifying means for amplifying a signal on said second terminal and providing an inverted amplified output; and
a second signal means having fourth, fifth and sixth terminals for providing a signal at said sixth terminal which is the summation of signals at said fourth and fifth terminals, said third terminal being coupled to said fourth terminal and said fifth terminal being coupled to receive said inverted amplified output.

3. The circuit of claim 1 or 2 wherein said sixth terminal is coupled to receive an input signal and said first terminal is coupled to provide an output signal.

4. The circuit of claim 1 or 2 wherein said first signal means and said second signal means are each directional couplers.

5. The circuit of claim 1 or 2 further comprising means for providing a time delay between said third and fourth terminals equal to a time delay introduced by said amplifier means between said second and fifth terminals.

6. A feedforward system comprising:
a first signal means having first, second and third terminals for providing at said first terminal a signal which is the sum of the signals on said second and third terminals;
a band reject filter having an input coupled to said second terminal and providing a filtered output;
means for amplifying said filtered output; and
second signal means having fourth, fifth and sixth terminals for providing a signal on said sixth terminal which is the difference between a signal on said fourth and fifth terminals, said third terminal being coupled to said fourth terminal and said fifth terminal being coupled to receive the amplified filtered output.

7. A feedforward system comprising:
a first signal means having first, second and third terminals and providing a signal on said first terminal which is the sum of signals on said second and third terminals;
a band reject filter having an input coupled to said second terminal and providing a filtered output;
inverting amplifying means for amplifying and inverting said filtered output;
a second signal means having fourth, fifth and sixth terminals for providing a signal on said sixth terminal which is the summation of signals on said fourth and fifth terminals, said third terminal being coupled to said fourth terminal and said fifth terminal being coupled to receive the inverted amplified filtered output.

8. The system of claim 6 or 7 wherein said band reject filter includes a center frequency and further including means for tuning the center frequency of said band reject filter.

9. The system of claim 6 or 7 wherein said band reject filter comprises a first directional coupler, a second directional coupler, and a bandpass filter coupled between said first and second directional coupler and having a center frequency and a passband about that center frequency.

10. The system of claim 6 or 7 wherein said band reject filter comprises:
   a first directional coupler means for sampling an input signal to obtain a first sampled signal and a second sampled signal;
   bandpass filter means having a center frequency and coupled to receive said first sampled signal and provide a filtered first sampled signal having only frequencies in a bandwidth about said center frequency, said bandpass filter means including means responsive to a control signal for varying the center frequency of said bandpass filter means;
   a second directional coupler means coupled to provide an output of the difference between the filtered first sampled signal and the second sampled signal as a band reject filter output;
   first sensor means for sensing said filtered first sampled signal to obtain a first sensed signal;
   second sensor means for sensing the second sampled signal to obtain a second sensed signal; and
   means responsive to said first sensed signal and said second sensed signal for providing an output, said output being coupled as the control signal to said bandpass filter means for varying the center frequency.

11. The system of claim 10 wherein said means responsive to said first and second sensed signals comprises mixer means for mixing said first sensed signal with said second sensed signal to provide a mixed signal, means for providing a reference signal, and means for comparing the reference signal with said mixed signal to obtain a difference signal which is coupled to provide the control signal to said bandpass filter means for varying the center frequency.

12. The system of claim 10 wherein said means for comparing comprises a first comparator coupled to receive said reference signal and said mixed signal and provide a first difference signal, means for providing a variable reference signal, and a second comparator coupled to receive said variable reference signal and said first difference signal and provide a second difference signal, said second difference signal being coupled as said control signal to said bandpass filter means for varying the center frequency.

13. The system of claim 10 further comprising means for compensating for amplitude variations between the filtered first sampled signal and said second sampled signal.

14. The system of claim 10 wherein said means for compensating comprises:
   first detector means for detecting the filtered first sampled signal to obtain a first detected signal;
   second detector means for detecting the second sampled signal to obtain a second detected signal;
   means for providing a second reference signal;
   variable gain amplifier means for controlling the amplitude of said second detected signal in response to said second reference signal to provide a controlled detected signal;
   difference means for providing an output of the difference between said first detected signal and the controlled detected signal; and
   attenuator means responsive to said difference output from said difference means for attenuating the amplitude of said second sampled signal.

15. The system of claim 6 or 7 wherein said band reject filter comprises:
   a first directional coupler means for sampling an input signal and providing an output of a first sampled signal and a second sampled signal;
   bandpass filter means having a center frequency and coupled to receive said first sampled signal and provide a filtered sampled signal having only frequencies of said first sampled signal in a bandwidth about the center frequency;
   a second directional coupled means coupled to provide an output of the difference between the filtered first sampled signal and the second sampled signal as a band reject filter output; and
   means for compensating for amplitude variations between the filtered first sampled signal and said second sampled signal comprising first detector means for detecting the first sampled signal and providing a first detected signal, means for providing a reference signal, second detector means for detecting the second sampled signal and providing a second detected signal, variable gain amplifier means coupled to control the amplitude of the second detected signal in response to said reference signal and provide a controlled detected signal, difference means coupled to provide an output of the difference between the first detected signal and the controlled detected signal as an adjusting signal, and means for attenuating the amplitude of the second sampled signal in response to said adjusting signal.

* * * * *